(12) United States Patent
Sugita

(10) Patent No.: US 12,435,244 B2
(45) Date of Patent: Oct. 7, 2025

(54) POLISHING COMPOSITION AND METHOD OF POLISHING SILICON WAFER

(71) Applicant: NITTA DuPont Incorporated, Osaka (JP)

(72) Inventor: Noriaki Sugita, Kyoto (JP)

(73) Assignee: NITTA DUPONT INCORPORATED, Osaka (JP)

( * ) Notice: Subject to any disclaimer, the term of this patent is extended or adjusted under 35 U.S.C. 154(b) by 194 days.

(21) Appl. No.: 18/258,555

(22) PCT Filed: Nov. 17, 2021

(86) PCT No.: PCT/JP2021/042157
§ 371 (c)(1),
(2) Date: Jun. 21, 2023

(87) PCT Pub. No.: WO2022/137897
PCT Pub. Date: Jun. 30, 2022

(65) Prior Publication Data
US 2024/0052202 A1    Feb. 15, 2024

(30) Foreign Application Priority Data
Dec. 23, 2020  (JP) .................. 2020-213457

(51) Int. Cl.
*C09G 1/02* (2006.01)
*B24B 37/04* (2012.01)
(Continued)

(52) U.S. Cl.
CPC .............. *C09G 1/02* (2013.01); *B24B 37/044* (2013.01); *C09K 3/14* (2013.01); *H01L 21/30625* (2013.01)

(58) Field of Classification Search
None
See application file for complete search history.

(56) References Cited

U.S. PATENT DOCUMENTS 10,696,869 B2 *  6/2020  Sugita .................. C09G 1/02
2010/0003821 A1  1/2010  Morinaga et al.
(Continued)

FOREIGN PATENT DOCUMENTS

JP    2001015461 A    1/2001
JP    2009147267 A    7/2009
(Continued)

OTHER PUBLICATIONS

Office Action in TW Application No. 110147875, dated Nov. 25, 2024, 6 pp.

*Primary Examiner* — Roberts P Culbert
(74) *Attorney, Agent, or Firm* — HAUPTMAN HAM, LLP

(57) ABSTRACT

A polishing composition is provided that can reduce microdefects on a semiconductor wafer after polishing. A polishing composition includes: an abrasive; a basic compound; a wetting agent; and a non-ionic surfactant, where the surface tension $Y_{ud}$ is not higher than 64 mN/m, and the ratio of the surface tension after dilution with water by a factor of 20, $Y_d$, to the surface tension $Y_{ud}$, denoted by $Y_d/Y_{ud}$, is not lower than 1.10 and not higher than 1.40. Here, the surface tensions $Y_{ud}$ and $Y_d$ are measurements at 25° C.

6 Claims, 1 Drawing Sheet

(51) Int. Cl.
*C09K 3/14* (2006.01)
*H01L 21/306* (2006.01)

(56) References Cited

U.S. PATENT DOCUMENTS

| | | | |
|---|---|---|---|
| 2011/0121224 A1* | 5/2011 | Matsushita | C09K 3/1436 252/79.1 |
| 2015/0079789 A1 | 3/2015 | Mori et al. | |

FOREIGN PATENT DOCUMENTS

| | | |
|---|---|---|
| JP | 2010034509 A | 2/2010 |
| JP | 2011061089 A | 3/2011 |
| JP | 2012216723 A | 11/2012 |
| WO | 2013137212 A1 | 9/2013 |

\* cited by examiner

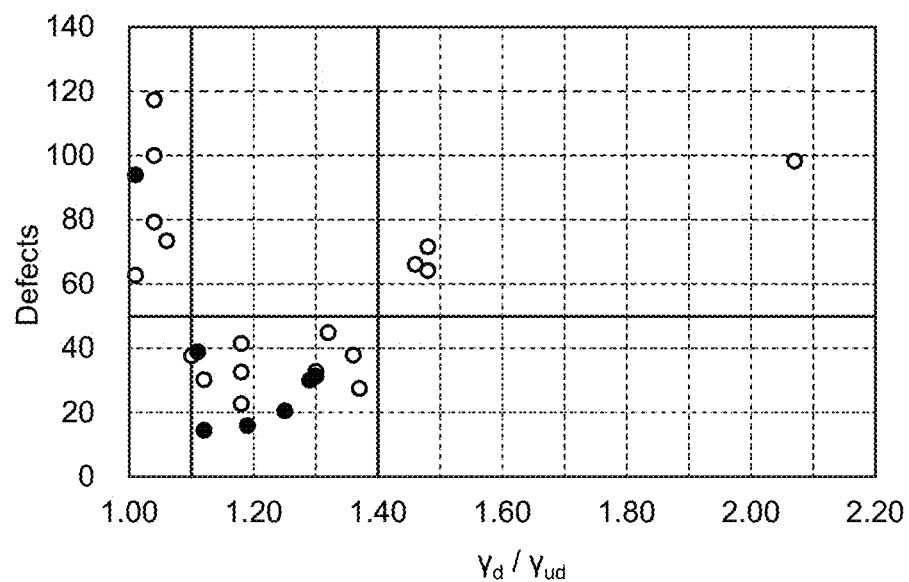

POLISHING COMPOSITION AND METHOD OF POLISHING SILICON WAFER

RELATED APPLICATIONS

The present application is National Phase of International Application Number PCT/JP2021/042157, filed Nov. 17, 2021, and claims priority based on Japanese Patent Application No. 2020-213457, filed Dec. 23, 2020.

TECHNICAL FIELD

The present invention relates to a polishing composition and a method of polishing a silicon wafer.

BACKGROUND ART

During polishing of a semiconductor wafer by CMP, multiple polishing stages are performed to achieve smoothening and planarization with high precision. The finish-polishing step, which is performed at the last stage, mainly aims at reducing micro-defects.

A polishing composition is used to polish a semiconductor wafer; particularly, during the finish-polishing step for a silicon wafer, a polishing composition is used that typically contains a water-soluble polymer such as hydroxyethyl cellulose described in, for example, JP 2001-15461 A, JP 2010-34509 A, or JP 2011-61089 A. A water-soluble polymer works to hydrophilize the surface of the semiconductor wafer, thereby preventing, for example, adherence of abrasive grains to the surface, excess chemical etching, and/or agglomeration of abrasive grains to prevent damage to the semiconductor wafer. It is known that micro-defects can be thus reduced.

PRIOR ART DOCUMENTS

Patent Documents

Patent Document 1: JP 2012-216723 A
Patent Document 2: JP 2009-147267 A
Patent Document 3: WO 2013/137212

DISCLOSURE OF THE INVENTION

Design rules for semiconductor devices have become finer and finer in recent years, a trend that requires stricter control of micro-defects on the surface of a semiconductor wafer. Even the techniques mentioned above only provide insufficient levels of surface quality after polishing in light of the recent levels required, and there is a demand for further improvements.

An object of the present invention is to provide a polishing composition that can reduce micro-defects on a semiconductor wafer after polishing.

A polishing composition according to an embodiment of the present invention includes: an abrasive; a basic compound; a wetting agent; and a non-ionic surfactant, wherein a surface tension $Y_{ud}$ is not higher than 64 mN/m, and a ratio of a surface tension after dilution with water by a factor of 20, $Y_d$, to the surface tension $Y_{ud}$, denoted by $Y_d/Y_{ud}$, is not lower than 1.10 and not higher than 1.40. Here, the surface tensions $Y_{ud}$ and $Y_d$ are measurements at 25° C.

The present invention will reduce micro-defects on a semiconductor wafer after polishing.

BRIEF DESCRIPTION OF DRAWINGS

FIG. 1 is a scatter diagram illustrating the relationship between $Y_d/Y_{ud}$ of a polishing composition and the number of micro-defects on a wafer after polishing (relative value).

EMBODIMENTS FOR CARRYING OUT THE INVENTION

To solve the above-stated problems, the present inventor conducted various investigations, and discovered that the protective effect of a polishing composition for the abrasive and wafer surface and its conformability in water will be better balanced by adjusting the surface tension of the polishing composition, $Y_{ud}$, and the ratio of the surface tension after dilution of this polishing composition with water by a factor of 20, $Y_d$, to the surface tension $Y_u d$, denoted by $Y_d/Y_u d$, into respective predetermined ranges, thereby reducing micro-defects.

The present invention was made based on this finding. A polishing composition according to an embodiment of the present invention will now be described in detail.

A polishing composition according to an embodiment of the present invention includes: an abrasive; a basic compound; a wetting agent; and a non-ionic surfactant, wherein a surface tension $Y_{ud}$ is not higher than 64 mN/m, and a ratio of a surface tension after dilution with water by a factor of 20, $Y_d$, to the surface tension $Y_{ud}$, denoted by $Y_d/Y_{ud}$, is not lower than 1.10 and not higher than 1.40. Here, the surface tensions $Y_{ud}$ and $Y_d$ are measurements at 25° C.

The abrasive used may be one that is commonly used in this field, and may be, for example, colloidal silica, fumed silica, colloidal alumina, fumed alumina, or ceria, where colloidal silica and fumed silica are particularly suitable. The abrasive is not limited to any particular grain size, and may be, for example, one with a mean secondary particle size of 30 to 100 nm. A lower limit for the mean secondary particle size of the abrasive is preferably 40 nm, and more preferably 50 nm. An upper limit for the mean secondary particle size of the abrasive is preferably 90 nm.

The content of the abrasive is not limited to any particular value, and may be, for example, 0.10 to 20.0% by weight of the entire polishing composition (undiluted). A lower limit for the content of the abrasive is preferably 1.0% by weight, more preferably 3.0% by weight, and yet more preferably 5.0% by weight. An upper limit for the content of the abrasive is preferably 18.0% by weight, more preferably 15.0% by weight, and yet more preferably 12.0% by weight.

Prior to use, the polishing composition is diluted by a factor of 5 to 100, for example, for polishing. Preferably, a polishing composition according to an embodiment is diluted prior to use such that the concentration of the abrasive is 100 to 8000 ppm (ppm by weight; the same applies hereinafter). A lower limit for the dilution factor is preferably 10, and more preferably 15. An upper limit for the dilution factor is preferably 80, more preferably 60, and yet more preferably 50.

A basic compound efficiently reacts with the wafer surface and contributes to polishing performance in chemical-mechanical polishing (CMP). The basic compound may be, for example, ammonia, an ammonium compound, an amine compound or an inorganic alkali compound.

Examples of ammonium compounds include ammonium salts and quaternary ammonium hydroxides. Specific examples include tetramethylammonium hydroxide (TMAH), tetraethylammonium hydroxide (TEAH), and tetrabutylammonium hydroxide (TBAH).

Examples of amine compounds include primary amines, secondary amines, tertiary amines, heterocyclic amines, and salts thereof. Specific examples include methylamine, dimethylamine, trimethylamine, ethylamine, diethylamine, triethylamine, hexylamine, cyclohexylamine, ethylenediamine, hexamethylenediamine, diethylenetriamine (DETA), triethylenetetramine, tetraethylenepentamine, pentaethylenehexamine, monoethanolamine, diethanolamine, triethanolamine, N-(β-aminoethyl)ethanolamine, anhydrous piperazine, piperazine hexahydrate, 1-(2-aminoethyl) piperazine, N-methylpiperazine, piperazine hydrochloride, and guanidine carbonate.

Examples of inorganic alkali compounds include alkali metal hydroxides, alkali metal salts, alkali-earth metal hydroxides, and alkali-earth metal salts. Specific examples of inorganic alkali compounds include potassium hydroxide, sodium hydroxide, potassium hydrogencarbonate, potassium carbonate, sodium hydrogencarbonate, and sodium carbonate.

One of the above-listed basic compounds may be used alone, or a mixture of two or more thereof may be used. Particularly preferable ones of the above-listed basic compounds are alkali metal hydroxides, alkali metal salts, ammonia, ammonium salts, and quaternary ammonium hydroxides.

The content of the basic compound (if two or more basic compounds are contained, their total amount) is not limited to any particular value, and may be, for example, 0.01 to 1.50% by weight of the entire polishing composition (undiluted). A lower limit for the content of the basic compound is preferably 0.05% by weight, and more preferably 0.10% by weight. An upper limit for the content of the basic compound is preferably 1.20% by weight, more preferably 1.00% by weight, and yet more preferably 0.80% by weight.

A wetting agent is a substance effective in keeping the surface of a wafer hydrophilic. If the hydrophilicity of the surface of a wafer decreases, foreign substances are more likely to adhere to the wafer and, in addition, cannot easily be removed by washing and thus they are more likely to remain. If foreign substances remain on the wafer, the surface precision of the wafer may decrease.

Examples of wetting agents include cellulose derivatives, vinyl polymers, and polysaccharides. Examples of cellulose derivatives include hydroxyethyl cellulose, hydroxypropyl cellulose, and hydroxypropyl methyl cellulose. Examples of vinyl polymers include polyvinyl alcohols, modified polyvinyl alcohols, polyvinyl pyrrolidone, poly-N-vinylformamide, copolymers of a polyvinyl alcohol and polyvinyl pyrrolidone, and copolymers of a modified polyvinyl alcohol and polyvinyl pyrrolidone. Examples of polysaccharides include starch, cyclodextrins, trehalose, and pullulan. Examples of other wetting agents include polyacrylamide and polymethyl methacrylate.

An example of a modified polyvinyl alcohol is a vinyl alcohol-based resin having a 1,2-diol structural unit represented by general formula (1) given below. In other words, this modified polyvinyl alcohol has a 1,2-diol structural unit represented by formula (1) in addition to a structural unit of a polyvinyl alcohol. The amount of modified 1,2-diol structural unit in the polymer is not limited to any particular value, and may be, for example, 1 to 20 mol %.

[Chem. 1]

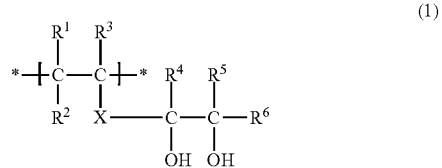

Here, each of $R^1$, $R^2$ and $R^3$ independently indicates a hydrogen atom or an organic group, X indicates a single bond or a bonding chain, and each of $R^4$, $R^5$ and $R^6$ independently indicates a hydrogen atom or an organic group.

Particularly preferable modified polyvinyl alcohols having a 1,2-diol structural unit are ones in which all of $R^1$ to $R^6$ in the 1,2-diol structural unit represented by general formula (1) are hydrogen atoms and X is a single bond. That is, ones including a structural unit of formula (2) given below are particularly preferable:

[Chem. 2]

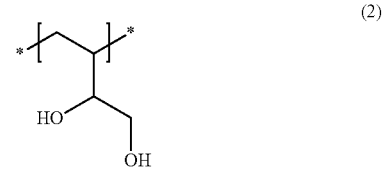

Preferable wetting agents are cellulose derivatives and modified polyvinyl alcohols, which are highly capable of giving wettability to the surface of a wafer and can be easily washed off such that they do not remain on the wafer. A particularly preferable cellulose derivative is hydroxyethyl cellulose. A preferable modified polyvinyl alcohol is a modified polyvinyl alcohol having a 1,2-diol structural unit, discussed above.

The content of the wetting agent (if two or more wetting agents are contained, their total amount) is not limited to any particular value, and may be, for example, 0.01 to 1.20% by weight of the entire polishing composition (undiluted). A lower limit for the content of the wetting agent is preferably 0.05% by weight, and more preferably 0.10% by weight. An upper limit for the content of the wetting agent is preferably 0.90% by weight, and more preferably 0.60% by weight.

A non-ionic surfactant is effective in reducing microdefects. Examples of non-ionic surfactants include ethylenediamine tetrapolyoxyethylene polyoxypropylene (poloxamines), oxyalkylene polymers, copolymers of multiple oxyalkylenes (e.g., diblock, triblock, random, and alternating copolymers), polyoxyalkylene alkyl ethers, polyoxyalkylene glyceryl ethers, polyoxyalkylene alkyl phenyl ethers, polyoxyalkylene alkylamines, polyoxyalkylene alkylamides, polyoxyalkylene fatty acid esters, polyoxyethylene sorbitan fatty acid esters, polyoxyalkylene castor oils, and polyoxyalkylene methylglucosides.

Examples of oxyalkylene polymers include polyethylene glycols and polypropylene glycols. Examples of copolymers of multiple oxyalkylenes include polyoxyethylene polyoxypropylene ethers, trimethylolpropane tris(polyoxyethylene polyoxypropylene) ethers, and polyoxyethylene polyoxypropylene butyl ethers. Examples of polyoxyalkylene alkyl ethers include polyoxyethylene decyl ethers, polyoxyethylene lauryl ethers, polyoxyethylene cetyl ethers, and polyoxyethylene stearyl ethers. Examples of polyoxyalkylene glyceryl ethers include polyoxyethylene glyceryl ethers and polyoxypropylene glyceryl ethers. Examples of polyoxyalkylene alkyl phenyl ethers include polyoxyethylene octylphenyl ethers, polyoxyethylene nonylphenyl ethers, and polyoxyethylene para-cumylphenyl ethers. Examples of polyoxyalkylene alkylamines include polyoxyethylene laurylamine and polyoxyethylene oleylamine. Examples of polyoxyalkylene alkylamides include polyoxyethylene oleylamide and polyoxyethylene stearylamide. Examples of polyoxyalkylene fatty acid esters include polyoxyethylene monolaurate and polyoxyethylene monostearate. Examples of polyoxyethylene sorbitan fatty acid esters include polyoxyethylene sorbitan monolaurate and polyoxyethylene sorbitan monopalmitate. Examples of polyoxyalkylene castor oils include polyoxyethylene castor oils and polyoxyethylene hardened castor oils. Examples of polyoxyalkylene methylglucosides include polyoxyethylene methylglucosides and polyoxypropylene methylglucosides.

The content of the non-ionic surfactant (if two or more surfactants are contained, their total amount) is not limited to any particular value, and may be, for example, 0.1 to 1000 ppm of the entire polishing composition (undiluted). A lower limit for the content of the non-ionic surfactant is preferably 5 ppm, more preferably 10 ppm, yet more preferably 30 ppm, still more preferably 50 ppm, and yet more preferably 80 ppm. An upper limit for the content of the non-ionic surfactant is preferably 800 ppm, and more preferably 600 ppm.

A polishing composition according to an embodiment may further include a pH controller. The pH of a polishing composition according to an embodiment is preferably 8.0 to 12.0.

The balance of a polishing composition according to an embodiment is mainly water. A polishing composition according to an embodiment may include, in addition to the above, any ingredient(s) that is/are generally known in the field of polishing compositions, such as an organic acid, an inorganic acid, an antiseptic, an antifoaming agent, or a chelate agent, as desired.

In a polishing composition according to an embodiment, the surface tension $Y_{ud}$ is not higher than 64 mN/m, and the ratio of the surface tension after dilution with water by a factor of 20, $Y_d$, to the surface tension $Y_{ud}$, denoted by $Y_d/Y_{ud}$, is not lower than 1.10 and not higher than 1.40. Here, the surface tensions $Y_d$ and $Y_{ud}$ are measurements at 25° C.

That is, the surface tension of the undiluted polishing composition according to an embodiment, $Y_{ud}$, is not higher than 64 mN/m and, where the surface tension after dilution of this undiluted solution by a factor of 20, in other words, after mixing of the undiluted solution and water in a weight ratio of 1:19, is denoted by $Y_d$, then, $Y_d/Y_{ud}$ is not lower than 1.10 and not higher than 1.40. This will reduce micro-defects.

Reducing the surface tension of the polishing composition improves the wettability and conformability of the wetting agent and non-ionic surfactant with respect to the abrasive surfaces. This increases the protective effect of the wetting agent and non-ionic surfactant with respect to the abrasive surfaces such that, for example, the abrasive is less likely to produce scratches during polishing of the wafer, and foreign substances are less likely to remain and can also be removed more easily. Further, similar to the protective effect of the wetting agent and non-ionic surfactant with respect to the abrasive surfaces, their protective effect with respect to the wafer surface is increased.

On the other hand, if the surface tension of the polishing composition is too low, the composition, during dilution with water, cannot easily conform in the water, leading to instable polishing performance. The protective effect with respect to the abrasive and wafer surface and the conformability in water will be better balanced by adjusting $Y_{ud}$ and $Y_d/Y_{ud}$ into respective predetermined ranges, thereby reducing micro-defects.

$Y_{ud}$ and $Y_d$ may be adjusted by adjusting the type and content of the abrasive, the type and content of the basic compound, the type and content of the wetting agent, and the type and content of the non-ionic surfactant. Particularly, the type and content of the wetting agent as well as the type and content of the non-ionic surfactant have significant effects; particularly, the type and content of the non-ionic surfactant have relatively large effects. Depending on the type, there is a tendency that the higher the content of the wetting agent, the lower the surface tension. Again depending on the type, there is a tendency that the higher the content of the non-ionic surfactant, the lower the surface tension. In addition, the anti-septic and antifoaming agent affect the surface tension.

Different polishing compositions with substantially equal values of $Y_{ud}$ may have different values of $Y_d/Y_{ud}$. That is, the increase in surface tension after dilution may vary depending on the ingredients of the polishing compositions. The increase in surface tension after dilution mainly depends on the type and concentration of the wetting agent and/or non-ionic surfactant.

An upper limit for $Y_{ud}$ is preferably 62 mN/m, more preferably 60 mN/m, yet more preferably 58 mN/m, and still more preferably 56 mN/m. A lower limit for $Y_{ud}$ is not limited to any particular value, and preferably 40 mN/m, more preferably 45 mN/m, and yet more preferably 50 mN/m.

An upper limit for $Y_d/Y_{ud}$ is preferably 1.35, more preferably 1.30, and yet more preferably 1.25. A lower limit for $Y_d/Y_{ud}$ is preferably 1.15.

A polishing composition according to an embodiment is prepared by appropriately mixing the abrasive, basic compound, wetting agent, non-ionic surfactant and other ingredients and then adding water. Alternatively, a polishing composition according to an embodiment may be prepared by successively mixing with water the abrasive, basic compound, wetting agent, non-ionic surfactant and other ingredients. These ingredients may be mixed by a means that is commonly used in the technical field of polishing compositions, such as a homogenizer or ultrasonics.

Such a polishing composition as described above is diluted with water to an appropriate concentration before being used to polish a semiconductor wafer. The water used for dilution may be, for example, ion-exchanged water, pure water, ultrapure water, or distilled water.

A polishing composition according to an embodiment can suitably be used for polishing, particularly finish-polishing, a silicon wafer (i.e., bare wafer). A method of polishing a silicon wafer according to an embodiment of the present invention includes polishing a silicon wafer using such a polishing composition as discussed above.

EXAMPLES

The present invention will now be described more specifically with reference to examples. The present invention is not limited to these examples.

Polishing compositions labeled Inventive Examples 1 to 15 and Comparative Examples 1 to 12 shown in Table 1 were prepared.

[Table 1]

TABLE 1

| | Polishing composition | | | | | | | | | | Polishing results | | |
| | Abrasive (silica) | | Basic compound | | Wetting agent | | Surfactant | | | | | Defects | |
| | Particle size (nm) | Content (wt %) | Type | Content (wt %) | Type | Content (wt %) | Type | Content (wt %) | $Y_{ud}$ (mN/m) | $Y_d/Y_{ud}$ | Dilution factor | Relative value | Wafer wettability |
|---|---|---|---|---|---|---|---|---|---|---|---|---|---|
| Inv. ex. 1 | 70 | 10.5 | NH$_4$OH | 0.40 | HEC-1 | 0.35 | S3 | 0.0025 | 50.6 | 1.32 | 30 | 45 | good |
| Inv. ex. 2 | 70 | 9.5 | NH$_4$OH | 0.50 | HEC-2 | 0.20 | S3 | 0.0025 | 58.2 | 1.18 | 20 | 33 | good |
| Inv. ex. 3 | 70 | 9.5 | NH$_4$OH | 0.50 | HEC-2 | 0.20 | S3 | 0.005 | 50.5 | 1.36 | 20 | 38 | good |
| Inv. ex. 4 | 70 | 9.5 | NH$_4$OH | 0.50 | HEC-2 | 0.20 | S4 | 0.0025 | 58.0 | 1.18 | 20 | 23 | good |
| Inv. ex. 5 | 70 | 9.5 | NH$_4$OH | 0.2 | HEC-3 | 0.36 | S4 | 0.0025 | 61.0 | 1.10 | 20 | 38 | good |
| Inv. ex. 6 | 70 | 9.5 | NH$_4$OH | 0.2 | HEC-3 | 0.36 | S6 | 0.015 | 50.7 | 1.30 | 20 | 33 | good |
| Inv. ex. 7 | 70 | 9.5 | NH$_4$OH | 0.2 | HEC-3 | 0.36 | S6 | 0.02 | 47.8 | 1.37 | 20 | 27 | good |
| Inv. ex. 8 | 70 | 7.8 | NH$_4$OH | 0.5 | HEC-3 | 0.40 | S6 | 0.005 | 58.1 | 1.12 | 60 | 30 | good |
| Inv. ex. 9 | 50 | 3.6 | NH$_4$OH | 0.1 | HEC-3 | 0.20 | S6 | 0.005 | 58.2 | 1.18 | 20 | 42 | good |
| Inv. ex. 10 | 70 | 9.5 | NH$_4$OH | 0.17 | modified PVA | 0.07 | S4 | 0.004 | 62.4 | 1.11 | 30 | 39 | good |
| Inv. ex. 11 | 70 | 9.5 | NH$_4$OH | 0.17 | modified PVA | 0.07 | S7 | 0.005 | 61.1 | 1.12 | 30 | 14 | good |
| Inv. ex. 12 | 70 | 9.5 | NH$_4$OH | 0.17 | modified PVA | 0.07 | S6 | 0.005 | 58.8 | 1.19 | 30 | 16 | good |
| Inv. ex. 13 | 70 | 9.5 | NH$_4$OH | 0.17 | modified PVA | 0.07 | S6 | 0.0075 | 55.6 | 1.25 | 30 | 21 | good |
| Inv. ex. 14 | 70 | 9.5 | NH$_4$OH | 0.17 | modified PVA | 0.07 | S6 | 0.01 | 53.5 | 1.29 | 30 | 30 | good |
| Inv. ex. 15 | 70 | 9.5 | NH$_4$OH | 0.17 | modified PVA | 0.07 | S3 | 0.04 | 53.0 | 1.30 | 30 | 31 | good |
| Comp. ex. 1 | 70 | 10.5 | NH$_4$OH | 0.40 | HEC-1 | 0.35 | — | 0 | 64.9 | 1.04 | 30 | 100 | good |
| Comp. ex. 2 | 70 | 10.5 | NH$_4$OH | 0.40 | HEC-1 | 0.35 | S1 | 0.045 | 44.4 | 1.48 | 30 | 72 | good |
| Comp. ex. 3 | 70 | 10.5 | NH$_4$OH | 0.40 | HEC-1 | 0.35 | S1 | 0.045 | 44.4 | 1.48 | 20 | 64 | good |
| Comp. ex. 4 | 70 | 9.5 | NH$_4$OH | 0.50 | HEC-2 | 0.20 | — | 0 | 66 | 1.04 | 20 | 79 | good |
| Comp. ex. 5 | 70 | 9.5 | NH$_4$OH | 0.50 | HEC-2 | 0.20 | S1 | 0.01 | 46.8 | 1.46 | 20 | 66 | good |
| Comp. ex. 6 | 70 | 9.5 | NH$_4$OH | 0.2 | HEC-3 | 0.36 | — | 0 | 64.3 | 1.04 | 20 | 117 | good |
| Comp. ex. 7 | 70 | 9.5 | NH$_4$OH | 0.2 | HEC-3 | 0.36 | S5 | 0.026 | 30.5 | 2.07 | 20 | 98 | good |
| Comp. ex. 8 | 70 | 7.8 | NH$_4$OH | 0.5 | HEC-3 | 0.40 | — | 0 | 64.7 | 1.01 | 60 | 63 | good |
| Comp. ex. 9 | 50 | 3.6 | NH$_4$OH | 0.1 | HEC-3 | 0.20 | — | 0 | 64.9 | 1.06 | 20 | 73 | good |
| Comp. ex. 10 | 70 | 9.5 | NH$_4$OH | 0.17 | modified PVA | 0.07 | — | 0 | 69.4 | 1.01 | 30 | 94 | good |
| Comp. ex. 11 | 70 | 9.5 | NH$_4$OH | 0.17 | modified PVA | 0.07 | S2 | 0.03 | 47.0 | 1.44 | 30 | 1769 | poor |
| Comp. ex. 12 | 70 | 9.5 | NH$_4$OH | 0.17 | modified PVA | 0.07 | S3 | 0.06 | 47.0 | 1.48 | 30 | 764 | poor |

The balance of the polishing composition in Table 1 was water. The abrasives used were colloidal silicas with mean secondary particle sizes of 50 nm and 70 nm. "HEC-1", "HEC-2" and "HEC-3" in the column labeled "Type" for the wetting agent mean hydroxyethyl celluloses with weight-average molecular weights Mw of 800,000, 500,000, and 250,000, respectively. "Modified PVA" means a butenediol vinyl alcohol polymer having a degree of polymerization of 450 and a degree of saponification not lower than 98 mol % (i.e., completely saponified). The meanings of "S1" to "S7" in the column labeled "Type" for the non-ionic surfactant are shown in Table 2.

TABLE 2

| | Mw | Chemical name |
|---|---|---|
| S1 | appx. 7000 | ethylenediamine tetrapolyoxyethylene polyoxypropylene (poloxamine), EO:PO = 40:60, block copolymer |
| S2 | appx. 2900 | polyoxyethylene polyoxypropylene ether, EO:PO = 34:66, block copolymer |
| S3 | appx. 4000 | trimethylolpropane tris(polyoxyethylene polyoxypropylene) ether, EO:PO = 50:50, random copolymer |
| S4 | appx. 1000 | polyoxyethylene polyoxypropylene butyl ether, EO:PO = 50:50, random copolymer |
| S5 | appx. 300 | polyoxyethylene decyl ether |
| S6 | appx. 600 | polyoxyethylene para-cumylphenyl ether |
| S7 | appx. 750 | polyoxyethylene para-cumylphenyl ether |

The surface tension $Y_{ud}$ of each of these polishing compositions before dilution and the surface tension $Y_d$ after dilution by a factor of 20 were measured. Surface tension was measured by a full-automatic contact angle meter (DropMaster DM-500 from Kyowa Interface Science Co., Ltd.). For each polishing composition, surface tension measurement was conducted five times for each of $Y_{ud}$ and $Y_d$ at 25° C., and the average was treated as the surface tension value ($Y_{ud}$ or $Y_d$).

The specific gravity of a polishing composition was also taken into consideration to determine the surface tension value. The specific gravity of a polishing composition was determined in the following manner: First, the weight of a dried empty specific gravity bottle, W1, was weighted by an electronic balance. The empty specific gravity bottle was filled with pure water and a lid was placed thereon, pure water on the surface was wiped off, and the total weight W2 was weighted. The specific gravity bottle was emptied of the pure water, filled with the polishing composition of interest, the lid was placed thereon and the polishing composition on the surface was wiped off before the total weight W3 was weighted. The specific gravity of the polishing composition was determined by the following equation:

$$\text{specific gravity of polishing composition} = (W3-W1)/(W2-W1)$$

Surface tension was measured by the pendent-drop method (i.e., hanging-drop method). Analysis was performed by the curve-fitting method (i.e., Young-Laplace method).

These inventive- and comparative-example polishing compositions were used to polish 12-inch silicon wafers. The silicon wafers used had p-type conductivity and had a resistivity not lower than 0.1 Ωcm and lower than 100 Ωcm. The surface polished was plane <100>. The polishing machine used was an SPP800S single-side polisher from Okamoto Machine Tool Works, Ltd. The polishing pad used was a suede pad. Each polishing composition was diluted by the relevant factor in the column labeled "Dilution factor" of Table 1, and was fed at a feed rate of 1 L/min. Polishing was performed for three minutes, where the rate of rotation of the surface plate was 50 rpm, the rate of rotation of the carrier was 49 rpm, and the surface pressure representing the polishing load was 100 gf/cm$^2$. Prior to polishing with the inventive- and comparative-example polishing compositions, preliminary polishing was performed for two minutes using polishing slurry Nanopure (registered trademark) NP7050S (from NITTA DuPont Incorporated).

Micro-defects on the silicon wafer after polishing were measured by a wafer surface tester (MAGICS M5640 from Lasertec Corporation). The results are shown in the column labeled "Defects" in Table 1. The values in this column are relative values, where Comparative Example 1 is considered to have a value of 100.

The wettability of each polished silicon wafer was evaluated. Specifically, the surface of each polished silicon wafer was rinsed with running water for 15 seconds, and then the silicon wafer was positioned upright and left stationary. After five seconds of stationary positioning, the wettability of the silicon wafer was evaluated. A wafer in which the distance between the polished surface's periphery and water-repellent area was 5 mm or smaller was determined to be "good", a wafer with a distance of 6 to 10 mm to be "acceptable", and a wafer with a distance of 11 mm or greater to be "poor". The results are shown in the column labeled "Wafer wettability" in Table 1.

As shown in Table 1, each of the polishing compositions labeled Inventive Examples 1 to 15, in which $Y_{ud}$ was not higher than 64 mN/m and $Y_d/Y_{ud}$ was not lower than 1.10 and not higher than 1.40, had a number of micro-defects of not more than 50% of that of the polishing composition of Comparative Example 1. Further, they were highly capable of giving wettability to a wafer.

FIG. 1 is a scatter diagram illustrating the relationship between $Y_d/Y_{ud}$ of a polishing composition and the number of micro-defects on a wafer after polishing (relative value). A hollow circle indicates that the wetting agent was based on hydroxyethyl cellulose (HEC-1, HEC-2 or HEC-3), and a solid circle indicates that the wetting agent was a modified polyvinyl alcohol. FIG. 1 demonstrates that micro-defects can be reduced if $Y_d/Y_{ud}$ is not lower than 1.10 and not higher than 1.40, regardless of whether the wetting agent is a hydroxyethyl cellulose-based one or modified polyvinyl alcohol.

Embodiments of the present invention have been described. The above-described embodiments are merely illustrative examples useful for carrying out the present invention. As such, the present invention is not limited to the above-described embodiments, and the above-described embodiments, when carried out, may be modified as appropriate without departing from the spirit of the invention.

The invention claimed is:

1. A polishing composition comprising:
   an abrasive;
   a basic compound;
   a wetting agent; and
   a non-ionic surfactant,
   wherein a surface tension $\gamma_{ud}$ is not higher than 64 mN/m, and
   a ratio of a surface tension after dilution with water by a factor of 20, $\gamma_d$, to the surface tension $\gamma_{ud}$, denoted by $\gamma_d/\gamma_{ud}$, is not lower than 1.10 and not higher than 1.40, where the surface tensions $\gamma_d$ and $\gamma_{ud}$ are measurements at 25° C.

2. The polishing composition according to claim 1, wherein the wetting agent is one or more selected from the group consisting of a cellulose derivative, a polysaccharide, and a vinyl polymer.

3. The polishing composition according to claim 1, wherein the basic compound is one or more selected from the group consisting of an alkali metal hydroxide, an alkali metal salt, ammonia, an ammonium salt, and a quaternary ammonium hydroxide.

4. The polishing composition according to claim 1, wherein the polishing composition is diluted by a factor of 5 to 100 prior to use.

5. The polishing composition according to claim 1, wherein the polishing composition is used to polish a silicon wafer.

6. A method of polishing a silicon wafer, comprising:
   polishing a silicon wafer using the polishing composition according to claim 1.

* * * * *